(12) United States Patent
McGowan et al.

(10) Patent No.: US 6,917,349 B2
(45) Date of Patent: Jul. 12, 2005

(54) DISPLAYING INFORMATION ON PASSIVE STORAGE MEDIUM

(75) Inventors: Steven B. McGowan, Portland, OR (US); Robert C. Brown, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 499 days.

(21) Appl. No.: 09/796,296

(22) Filed: Feb. 28, 2001

(65) Prior Publication Data

US 2002/0118165 A1 Aug. 29, 2002

(51) Int. Cl.$^7$ .............................................. G09G 3/00
(52) U.S. Cl. ...................................................... 345/30
(58) Field of Search ........................ 345/30, 700, 732; 348/716; 347/112; 349/12; 358/116, 1.16; 386/69; 707/4; 235/385; 364/519; 711/165

(56) References Cited

U.S. PATENT DOCUMENTS

| | | | | |
|---|---|---|---|---|
| 3,836,888 A | * | 9/1974 | Boenke et al. ............... 713/600 |
| 4,679,085 A | * | 7/1987 | Johnson et al. ............. 348/716 |
| 4,792,910 A | * | 12/1988 | Lange ....................... 358/1.16 |
| 5,159,182 A | * | 10/1992 | Eisele ......................... 235/492 |
| 5,532,830 A | * | 7/1996 | Schuler ...................... 386/125 |
| 5,557,677 A | * | 9/1996 | Prytz ........................... 380/212 |
| 5,654,732 A | * | 8/1997 | Katakura ....................... 345/95 |
| 5,666,531 A | * | 9/1997 | Martin ........................ 707/204 |
| 5,748,737 A | * | 5/1998 | Daggar .......................... 705/41 |
| 5,907,375 A | * | 5/1999 | Nishikawa et al. ............ 349/12 |
| 6,002,436 A | * | 12/1999 | Anderson ..................... 348/372 |
| 6,052,279 A | * | 4/2000 | Friend et al. ................ 361/686 |
| 6,111,654 A | * | 8/2000 | Cartier et al. ............... 358/1.16 |
| 6,121,961 A | * | 9/2000 | Feldman ...................... 345/204 |
| 6,178,487 B1 | * | 1/2001 | Ruff et al. ................... 711/165 |
| RE37,333 E | * | 8/2001 | Harada et al. ................. 349/34 |
| 6,317,141 B1 | * | 11/2001 | Pavley et al. ................ 345/732 |
| 6,338,435 B1 | * | 1/2002 | Carper ......................... 235/487 |
| 6,405,195 B1 | * | 6/2002 | Ahlberg .......................... 707/4 |
| 6,407,763 B1 | * | 6/2002 | Yamaguchi et al. ......... 347/112 |
| 6,425,525 B1 | * | 7/2002 | Swaminathan et al. ...... 235/385 |
| 6,425,825 B1 | * | 7/2002 | Sitrick ........................... 463/31 |
| 6,463,206 B1 | * | 10/2002 | Yuen et al. .................... 386/69 |
| 6,484,011 B1 | * | 11/2002 | Thompson et al. ......... 455/3.06 |
| 6,504,580 B1 | * | 1/2003 | Thompson et al. .......... 348/734 |
| 6,642,918 B2 | * | 11/2003 | Uchida et al. ............... 345/156 |
| 2003/0093187 A1 | * | 5/2003 | Walker ........................... 701/1 |
| 2003/0172205 A1 | * | 9/2003 | Bastian ......................... 710/45 |
| 2003/0220876 A1 | * | 11/2003 | Burger et al. ................. 705/50 |
| 2004/0212582 A1 | * | 10/2004 | Thielemans et al. ......... 345/107 |

FOREIGN PATENT DOCUMENTS

| | | | | |
|---|---|---|---|---|
| FR | 2731537 A1 | * | 3/1995 | |
| FR | 2731537 | * | 9/1996 | |
| JP | 403109524 A | * | 5/1991 | ................... 345/55 |

* cited by examiner

*Primary Examiner*—Vijay Shankar
*Assistant Examiner*—Prabodh Dharia
(74) *Attorney, Agent, or Firm*—Trop, Pruner & Hu, P.C.

(57) ABSTRACT

A way of displaying information on a passive storage medium for an active storing device. The passive storage medium comprises a storage unit to store information. The passive storage medium further comprises a display to display status information relating to the information stored in the storage unit.

7 Claims, 6 Drawing Sheets

DISPLAYING INFORMATION ON PASSIVE STORAGE MEDIUM

BACKGROUND

This invention relates generally to displaying information on a passive storage medium.

The use of passive storage media, such as diskettes, flash cartridges, and the like, is becoming popular in a variety of applications. For example, digital cameras and music players, such as Moving Picture Experts Group-1 Audio Layer-3 (MP3) players, routinely employ passive storage media to store images or music.

The popularity of passive storage media may be, in part, due to their relatively inexpensive cost, light-weight, reliability, and small-size. Additionally, the passive storage media offer portability to users, who may readily exchange music or pictures with each other.

It is not uncommon for a user to have a collection of passive storage media that may, for example, contain pictures taken from a camera, data files provided by a computer, music files recorded by a music player, and the like. In several instances, the user may not know the contents or the available storage capacity of the passive storage media. As such, to learn about the contents or the available storage space, the user is sometimes inconvenienced by having to use accessing devices, such as cameras, computers, and music players, to access the desired information of the passive storage medium.

Additionally, a user may sometimes be burdened with having to manually identify a particular passive storage medium, usually using conventional labels. That is, the user may write pertinent information identifying the passive storage medium and then affix the label to the storage device. In other instances, the user may transcribe the amount of available space on the label, and then update the label, as more or less information is stored on the passive storage medium.

Manually transcribing information on the label, however, may not only be inconvenient but also lead to erroneous labeling. For example, the user may be inconvenienced with having to carry a writing instrument to label the passive storage medium. The writing instrument, in some instances, may not always be readily available. While labeling, it may be possible that a user may incorrectly label the passive storage medium because of lack of concentration or momentary distraction.

Thus, there is a need to reliably display information on the passive storage medium.

BRIEF DESCRIPTION OF THE DRAWINGS

The invention may be understood by reference to the following description taken in conjunction with the accompanying drawings, in which like reference numerals identify like elements, and in which.

DETAILED DESCRIPTION

Figure 1:
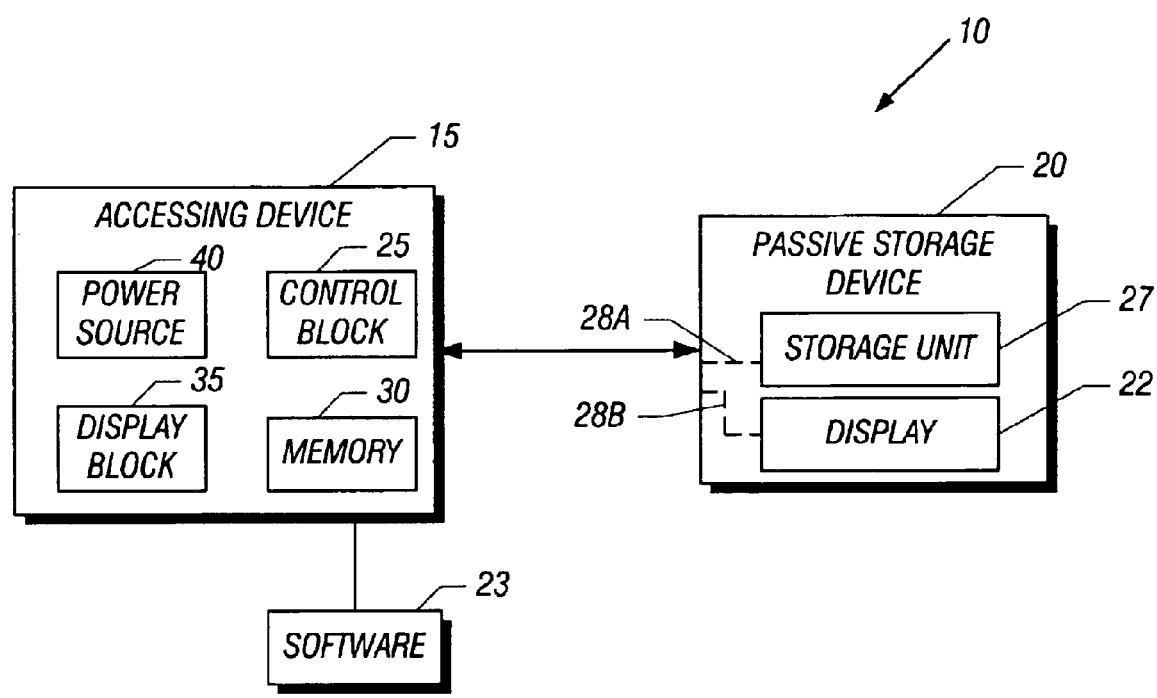
FIG. 1 is a stylized block diagram of a system comprising an accessing device and a passive storage medium, in accordance with one embodiment of the present invention.

Referring now to FIG. 1, a block diagram of a system 10 is shown in accordance with one embodiment of the present invention. In one embodiment, the system 10 includes an accessing device 15 and a passive storage medium 20 having a display 22.

Although not so limited, examples of the accessing device 15 may include a processor-based device, such as a computer or an appliance, an imaging device, such as a digital or analog standstill or video camera, a music player, such as a compact disc (CD) player, digital video disk (DVD) player, or MP3 player, video game controller, and the like.

The passive storage medium 20 may be any device where information, including data and computer instructions, may be stored by an active storing device, such as the accessing device 15. An "active device" is any device that uses electric power to operate. Examples of the passive storage medium 20 may include a floppy diskette, a video cassette, a memory stick, video game cartridge, flash cartridge, compact disc, digital video disk, and other portable storage devices.

In one embodiment, a software routine 23, when executed by a control block 25 of the accessing device 15, may store or retrieve information, such as images, music files and text files to and from the storage unit 27 of the passive storage medium 20. The passive storage medium 20, in one embodiment, may be inserted into a slot (not shown) of the accessing device 15. In an alternative embodiment, the passive storage medium 20 may be coupled to the accessing device 15 through a cable or any other means suitable to allow communication between the two devices 15, 20.

The accessing device 15, in one embodiment, may be capable of providing status information that may be shown on the display 22 of the passive storage medium 20. The "status information", in one embodiment, may include any information pertinent to the passive storage medium 20, such as a title or identifier identifying the passive storage medium 20, the amount of storage space available on the passive storage medium 20, the amount of storage space consumed on the passive storage medium 20, and percentage of storage space available or consumed on the passive storage medium 20.

The type of status information displayed on the display 22 of the passive storage medium 20 may vary from application to application. For example, if the passive storage medium 20 is a flash cartridge used to store music files, the status information displayed on the display 22 may include the number of songs stored, one or more titles of the songs, a title identifying the flash cartridge, and/or available storage space on the flash cartridge. Similarly, if the passive storage medium 20 is a digital video disk, the status information may include the title of a movie, one or more actors and actresses in the movie, or any other information pertinent to the contents of the digital video disk.

The software routine 23 may be stored in a memory 30 of the accessing device 15, in one embodiment. The software routine 23 may, in one embodiment, enable a display block 35 of the accessing device 15 to display the status information on the display 22 of the passive storage medium 20.

The accessing device 15 may access the storage unit 27 and the display 22 of the passive storage medium 20 in one of a variety of ways. For example, links 28A and 28B (indicated by dotted lines) may be used to access the storage unit 27 and the display 22, respectively. Each link 28A and 28B may comprise one or more electrically conductive paths, in one embodiment. In an alternative embodiment, the storage unit 27 and the display 22 may be accessed over a common link, where an address decoder (not shown) may be used to direct write access to either the storage unit 27 or the display 22. In yet another embodiment, the storage unit 27 may be accessed using the link 28A, while the display 20 is accessed, as described in more detail below, through the surface of the display 22.

In one embodiment, the accessing device 15 may include a power source 40 for supplying electrical power to the accessing device 15. For example, the power source 40 may be a rechargeable battery, or, alternatively, it may be an interface to an AC adapter, which may deliver power from an electrical outlet.

The display 22 of the passive storage medium 20 may be one of a variety of displays capable of displaying the status information. In one embodiment, the display 22 may be capable of nonvolatile image storage (i.e., the display 22 is able to retain an image or pattern without any further assistance of an electrical field). Examples of display 22 include an electronic paper, bi-stable liquid crystal display (LCD), bi-stable ferroelectric LCD, cholestric LCD, or any other display capable of retaining images or text without requiring much power. In one embodiment, the display 22 requires no power to retain an image or text.

Figure 2:
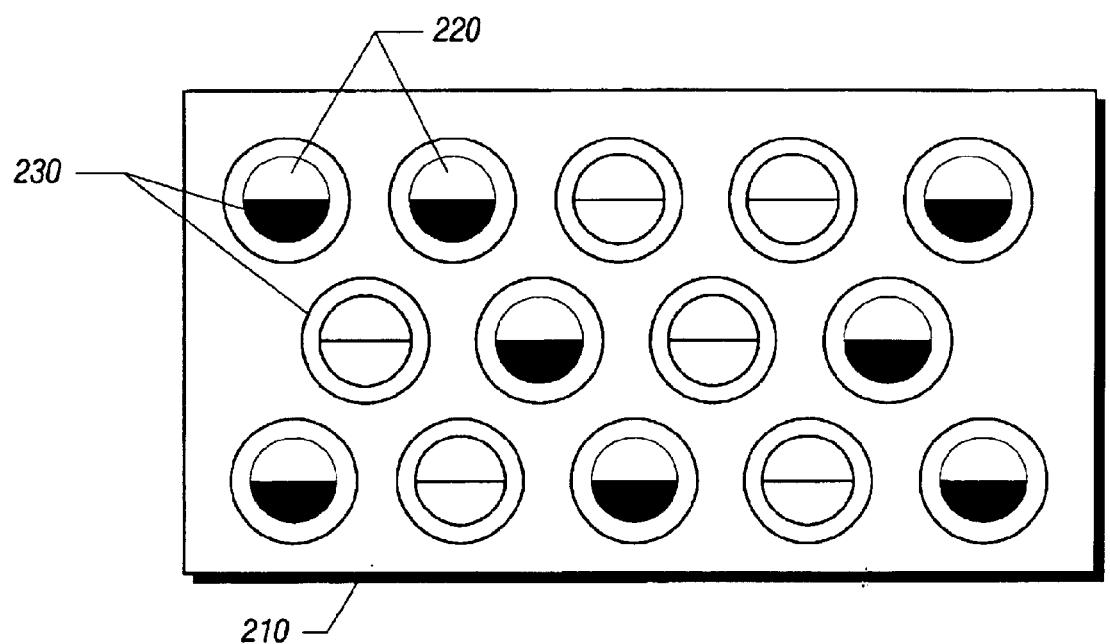
FIG. 2 is a sectional view of a display of the passive storage medium of FIG. 1, in accordance with one embodiment of the present invention.

FIG. 2 illustrates a sectional view of one embodiment of a display 210 that may be implemented as the display 22 of the passive storage medium 20 of FIG. 1. Although not so limited, FIG. 2 illustrates a sectional view of a Gyricon electric paper, which is well-known to those skilled in the art.

In one embodiment, the display 210 comprises a transparent rubber sheet laden with a high concentration of bichromal spheres (balls with a black and white hemisphere) 230, where each sphere 230 is contained within its own oil-filled cavity 220. In one embodiment, the spheres 230 rotate in response to an external electrical field provided by the display block 35 (see FIG. 1), exposing either their black or white hemispheres to a viewer according to the polarity of the field. The display block 35 may apply a pre-selected voltage level to the surface of the display 230, in one embodiment, to obtain the desired image or text. In an alternative embodiment, a magnetic field may be used to orient the spheres 230. In one embodiment, spheres having colors other than black and white may also be employed.

Once the rotation of the bichromal spheres 230 is complete, the spheres have a tendency to stick to the walls of the cavities 220, thereby providing extended memory without further consumption of power. In one embodiment, the display 210 is free of electronic addressing encumbrances, and may be used much like a sheet of pulp paper, but with the added benefit of erasability and reusability. That is, the display block 35 may, in one embodiment, cause images or text to be displayed, erased, and/or redisplayed on the display 210 using an electrical field, without having to decode addresses of locations and then writing to these locations.

Figure 3:
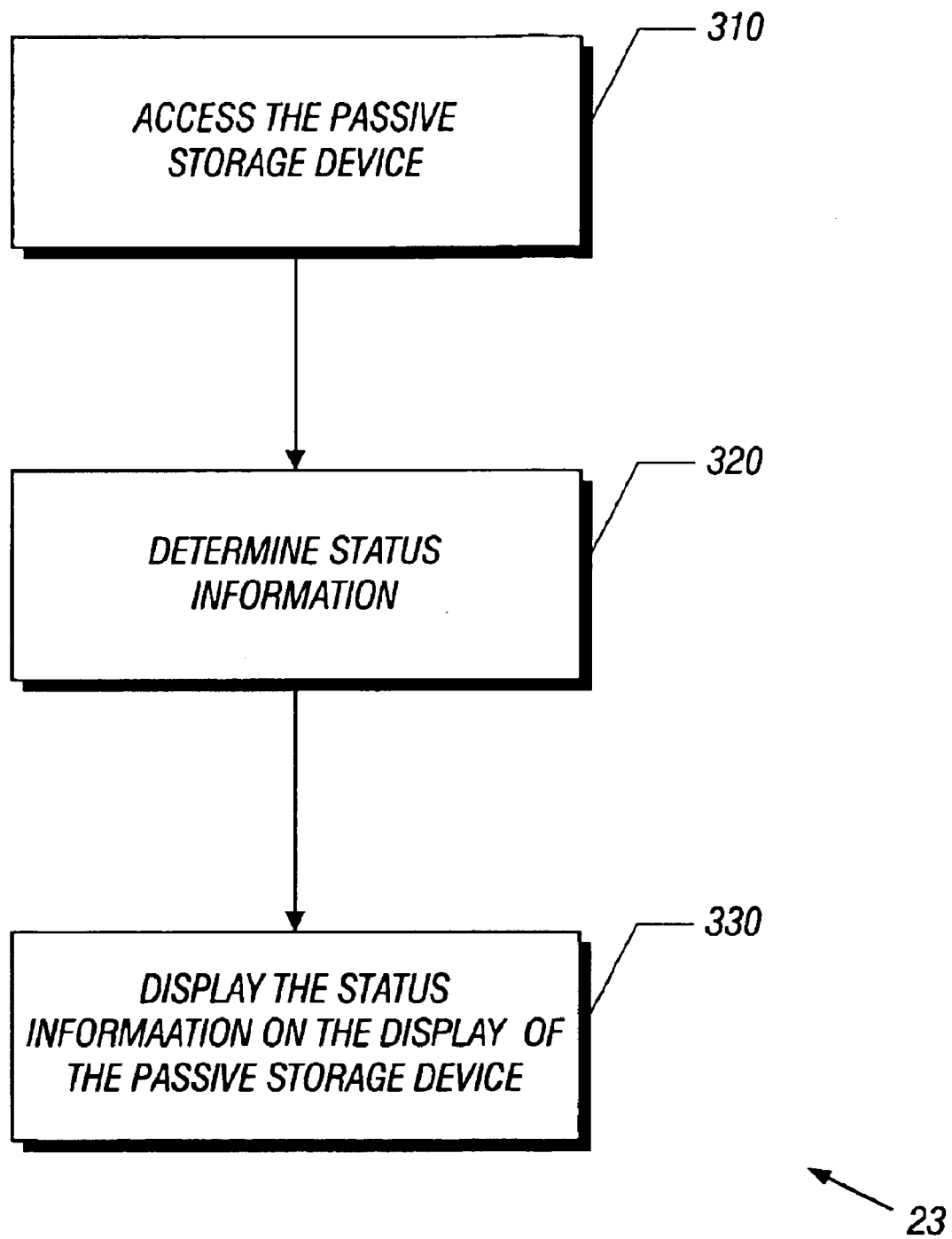
FIG. 3 is a flow chart of software that may be resident on the accessing device of FIG. 1, in accordance with one embodiment of the present invention.

Referring now to FIG. 3, one embodiment of a flow chart of the software routine 23 that may be executed on the control block 25 of the accessing device 15 is illustrated. In one embodiment, the accessing device 15 accesses (at 310) the passive storage medium 20.

The accessing device 15, in one embodiment, determines (at 320) status information in response to accessing (at 310) the passive storage medium 20. As mentioned above, the status information may include any information pertinent to the passive storage medium 20. For example, the accessing device 15 may determine (at 320) the amount of storage space available on the passive storage medium 20.

The display block 25 of the accessing device 15, in one embodiment, displays (at 330) the status information on the display of the passive storage medium 20. For example, if the accessing device 15 determines (at 320) that 2 (two) megabytes out of 10 (ten) megabytes are available on the passive storage medium 20, then the display block 35, in one embodiment, may display "2 megabytes" on the display 22 of the passive storage medium. The status information may, in an alternative embodiment, be expressed as a percentage (e.g., 20%, 2 megabytes/10 megabytes) of the available storage on the passive storage medium 20. The display block 35 of the accessing device 15 may cause the status information to be displayed on the display 22 of the passive storage medium using one or more of the techniques described above.

Figure 4A:
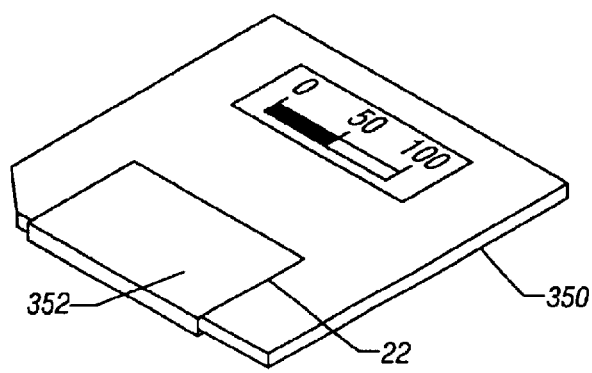
FIGS. 4A–4C illustrate exemplary passive storage media that may be employed in the system of FIG. 1, in accordance with one or more embodiments of the present invention.
Figure 4B:
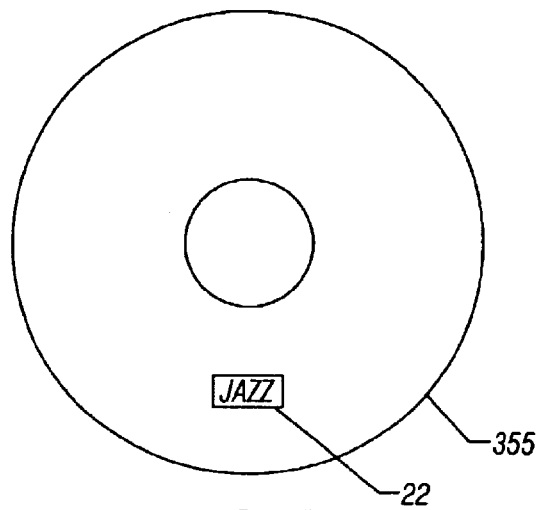
Figure 4C:
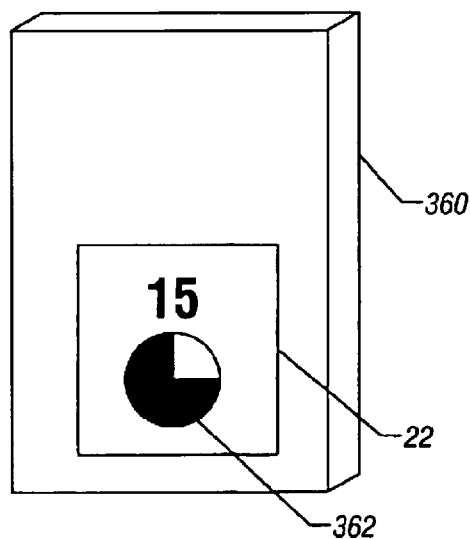

The status information may be displayed on the display 22 of the passive storage medium 20 in several ways, as shown in FIGS. 4A–4C. In one embodiment, the status information may be represented in a graphical format using bar graphs, pie charts, and the like. For example, a passive storage medium 20 may be represented by a bar graph that is half-filled, as shown in FIG. 4A. FIG. 4A illustrates a computer diskette 350 comprising the display 22 displaying a bar graph 352. As information is stored or deleted from the diskette 350, the bar graph 352 may be updated to reflect the available storage space accordingly, in one embodiment.

FIG. 4B illustrates a rewritable CD-ROM 355 that includes the display 22. The display 22 of the CD-ROM in the illustrated embodiment displays an identifier (e.g., "jazz") that may indicate to the user the nature of the contents of the CD-ROM 355. In one embodiment, the user, using the accessing device 15 may modify the identifier if the contents of the rewritable CD-ROM 355 are changed.

FIG. 4C illustrates a memory stick 360 having the display 22 depicting a pie chart 362 and a number (e.g., 15) of an image stored in the memory stick 360. The contents of the display 22, in one embodiment, may be updated as the information stored in the memory stick 360 is changed.

Figure 5:
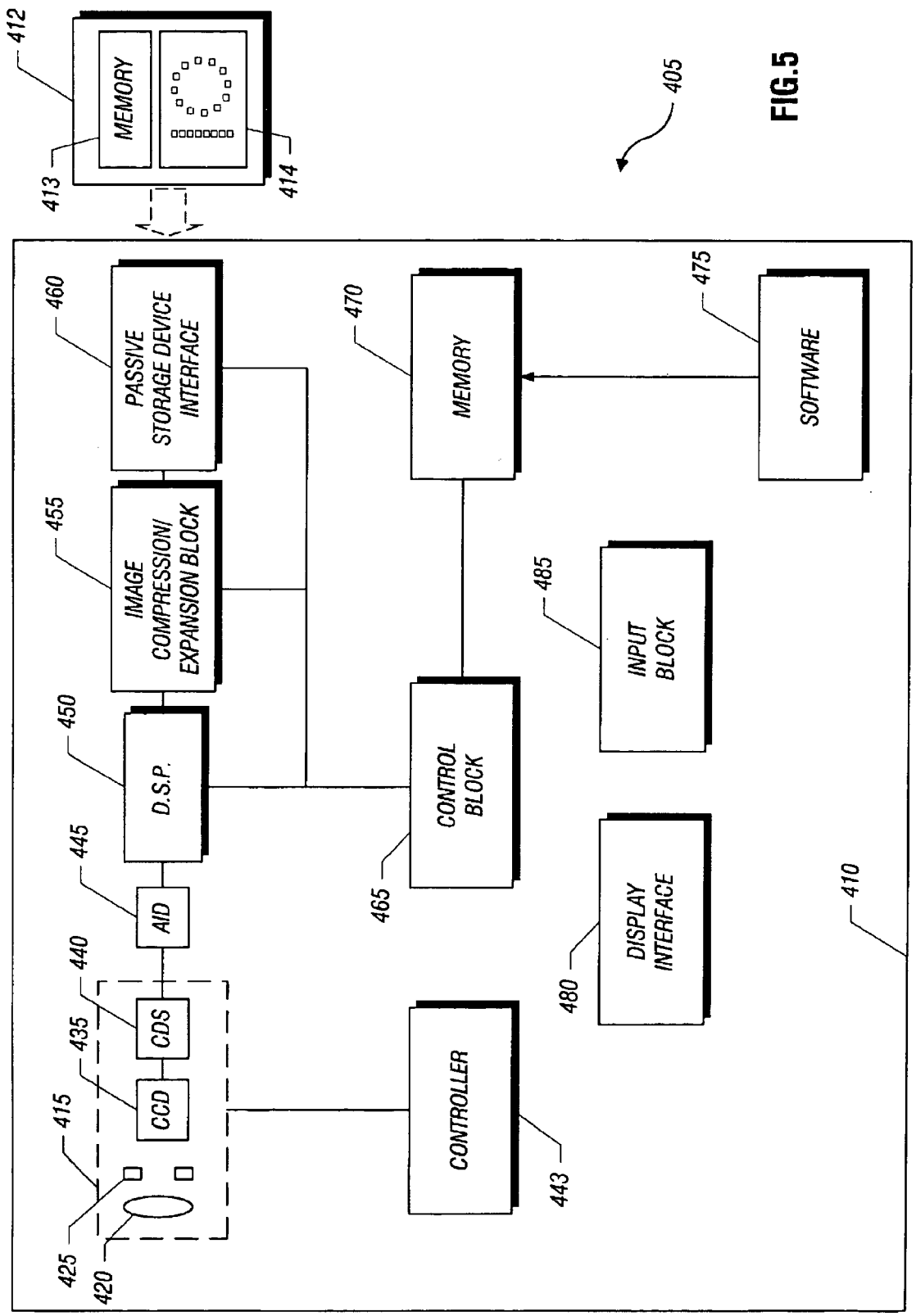
FIG. 5 is a block diagram of an imaging system, in accordance with one embodiment of the present invention.

Referring now to FIG. 5, a block diagram of one embodiment of an imaging system 405 having an imaging device 410 and a flash cartridge 412 is illustrated. In one embodiment, the imaging system 405 and flash cartridge 412 may be implemented as the accessing device 15 and the passive storage medium 20, respectively, of FIG. 1. In one embodiment, the imaging device 410 may be a digital camera. The flash cartridge 412, in one embodiment, includes a memory 413 for storing images and a display 414 for displaying storage information. The storage information, as utilized herein, refers to any information indicative of information stored on the flash cartridge 412, such as the amount of storage space available, the amount of storage space consumed, the number of stored images, and the percentage of storage space available. In the illustrative example the display 414 indicates that 10 (ten) images are stored on the flash cartridge 412.

The imaging device 410 includes an image photographing block 415 having a photographing lens 420, a lens opening 425, an image photographing element 435, such as a charge coupled device (CCD) or a complementary metal oxide semiconductor (CMOS) image photographing block. The image photographing element 435, in one embodiment, is a collection of tiny light-sensitive diodes, which convert photons (e.g., light) into electrons (e.g., electrical charge). Typically, each photosite is sensitive to light such that the brighter the light that hits a single photosite, the greater the electrical charge that will accumulate at that site. The analog output signal from the image photographing element 435 is provided to a correlative doubled sampler (CDS) block 440, which reduces noise from the analog signal, in one embodiment.

The imaging device 410, in one embodiment, includes a controller 443 for providing a variety of control signals to the image photographing block 415. For example, the controller 443 may provide a control signal to orient the photographing lens 420. The controller 443 may also provide a synchronization signal to the image photographing element 435, in one embodiment.

The output of the image photographing block 415 is provided to an analog-to-digital converter 445 that provides a digital image signal to a digital signal processing (DSP) block 450. The DSP block 450 may perform commonly known techniques on the digital signal, such as gamma-compensation, color separation, and generation of luminance signal Y and color difference signals Cb and Cr.

The imaging device 410, in one embodiment, includes an image data compression/expansion block 455 for encoding and decoding images using known image compression/ expansions techniques that transform images into and out of common graphical formats.

The imaging device 410, in one embodiment, includes a passive storage medium interface 460 through which the imaging device 410 communicates with the flash cartridge 412. In one embodiment, a software routine 475, when executed on a control block 465 of the imaging device 410, may store or retrieve information or data, such as images, to and from the memory 413 of the flash cartridge 412. In one embodiment, the software routine 475, when executed, may cause the passive storage medium interface 460 to apply an electrical signal to the display 414 to cause the storage information relating to the flash cartridge 412 to appear on the display 414. Once the storage information is displayed, the display 414 retains the storage information until a next update.

The imaging device 410, in one embodiment, includes a display interface 480 and an input block 485. The display interface 480 may provide an interface to a display (not shown) of the imaging device 410. On the display of the imaging device 410, a user may view one or more images stored on the flash cartridge 412, in one embodiment. The imaging device 410 may, in one embodiment, display to the user storage information relating to the flash cartridge 412. That is, once the flash cartridge 412 is coupled to (or inserted into) the imaging device 410, the imaging device 410 may access the contents of the memory 413 of the flash cartridge 412 and display the amount of storage space available, amount of storage space consumed, the number of images stored in the memory 413, and the like. In one embodiment, at least a portion of the storage information determined by the imaging device 410 may also be then shown on the display 414 of the flash cartridge 412. In one embodiment, the storage information is retained by the display 414 of the flash cartridge 412 after the flash cartridge 412 is removed from the imaging device 410.

The input block 485 of the imaging device 410 may, in one embodiment, allow a user to input commands, such as a command to take a picture when the shutter button is pressed, command to activate the flash, command to manually focus, and so forth. In one embodiment, the input block 485 may allow the user to enter information to identify a particular flash cartridge 412 where the information is then written to the display 414 of the flash cartridge 20. For example, the input block 485 may interface with a keypad to allow the user to input an identifier that may help the user in identifying a particular flash cartridge 412, identifiers such as "kids pics," "vacation pics," and the like.

Figure 6:
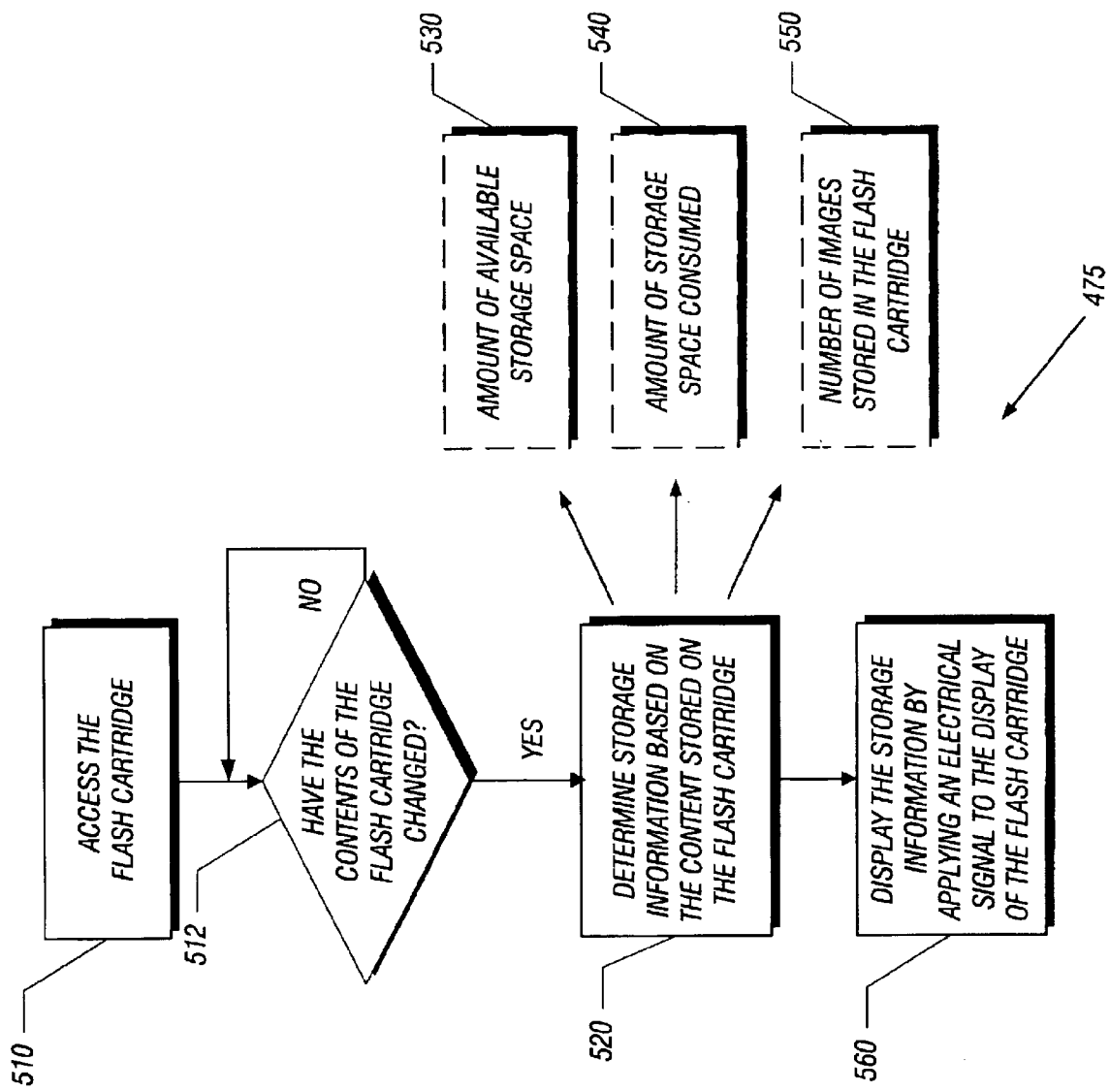
FIG. 6 is a flow chart of software that may be resident on an imaging device of the imaging system of FIG. 5, in accordance with one embodiment of the present invention.

Referring now to FIG. 6, one embodiment of a flow chart of the software routine 475 that may be executed on the control block 465 of the imaging device 410 is illustrated. In one embodiment, the imaging device 410 accesses (at 510) the flash cartridge 412. The flash cartridge 412 may be accessed, in one embodiment, once the flash cartridge 412 is inserted into the imaging device 410.

In one embodiment, the imaging device 410 determines (at 512) if the contents of the information stored in the memory 413 of the flash cartridge have changed. The contents of the memory 413 may have changed, for example, if images have either been added or deleted from the memory 413 of the flash cartridge 412.

If it is determined (at 512) that the contents of the memory 413 of the flash cartridge 412 changed, then the imaging device 410, in one embodiment, determines (at 520) the storage information based on the contents stored on the flash cartridge 412. In one embodiment, the imaging device 410 may determine (at 530) the amount of available storage space in the memory 413 of the flash cartridge 412. Alternatively, the amount of storage space consumed by previously stored images, for example, may be determined (at 540) by the imaging device 410. In one embodiment, the imaging device 410 may determine (at 550) the number of images that are stored in the memory 413 of the flash cartridge 412.

The imaging device 410, in one embodiment, displays (at 560) the storage information by applying an electrical signal to the display 414 of the flash cartridge 412. In one embodiment, the imaging device 410 may apply an electrical field to the surface area of the display 414, causing the storage information to be displayed on the display 414 of the flash cartridge 412.

The various system layers, routines, or modules may be executable control blocks (such as control block 25 (see FIG. 1) and control block 465 (see FIG. 5)) in the accessing device 15). Each control block 25, 465 may include a microprocessor, a microcontroller, a processor card (including one or more microprocessors or controllers), or other control or computing devices.

The storage units referred to in this discussion may include one or more machine-readable storage media for storing data and instructions. The storage media may include different forms or memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy, removable disks; other magnetic media including tape; and optical media such as compact disks (CDs) or digital video disks (DVDs). Instructions that make up the various software layers, routines, or modules in the various systems may be stored in respective storage devices. The instructions when executed by a respective control unit cause the corresponding system to perform programmed acts.

One or more of the elements on the accessing device 15 (see FIG. 1) or the imaging device 410 (see FIG. 5) may be implemented in hardware, software, or a combination thereof.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A passive storage medium for an active storing device, comprising:
   a storage unit to store information; and
   a bi-stable, electronic paper display to display status information relating to the information stored in the storage unit.

2. The passive storage medium of claim 1, wherein the display is updateable.

3. The passive storage medium of claim 1, wherein the display comprises one or more rotating spheres responsive to electrical signals.

4. The passive storage medium of claim 1, wherein the display comprises rotating spheres responsive to magnetic signals.

5. The passive storage medium of claim 1, wherein the display requires substantially no power to display the status information.

6. The passive storage medium of claim 1, wherein the storage unit stores at least one of an audio or video information.

7. The passive storage medium of claim 1, wherein the display displays the status information in one of a bar graph and pie chart.

* * * * *